United States Patent
Zimmerman et al.

(10) Patent No.: US 6,892,646 B1
(45) Date of Patent: May 17, 2005

(54) GRANULAR MATTER FILLED WEAPON GUIDANCE ELECTRONICS UNIT

(75) Inventors: Craig A. Zimmerman, Roseville, MN (US); Justin C. Dyster, Tucson, AZ (US); Mathew H. Bosse, Tucson, AZ (US); Norman Lange, Tuscon, AZ (US); Tovan Adams, Tucson, AZ (US); Lee Rodriguez, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/618,512

(22) Filed: Jul. 11, 2003

(51) Int. Cl.[7] .................................................. H05K 1/11
(52) U.S. Cl. ........................ 102/293; 361/804; 361/790; 361/758; 361/752
(58) Field of Search ........................ 102/293; 361/804, 361/790, 758, 752

(56) References Cited

U.S. PATENT DOCUMENTS

| | | | | |
|---|---|---|---|---|
| 2,752,537 A | * | 6/1956 | Wolfe ........................... | 361/792 |
| 2,856,852 A | * | 10/1958 | Hinman, Jr. et al. ......... | 102/214 |
| 2,976,806 A | * | 3/1961 | Risk et al. .................... | 361/732 |
| 3,081,416 A | * | 3/1963 | McCarthy et al. ........... | 361/822 |
| 3,110,262 A | * | 11/1963 | West ............................ | 102/399 |
| 3,434,014 A | * | 3/1969 | Taynton ....................... | 361/695 |
| 3,596,140 A | * | 7/1971 | Walsh .......................... | 361/784 |
| 3,904,934 A | * | 9/1975 | Martin ......................... | 361/803 |
| 3,999,105 A | * | 12/1976 | Archey et al. ............... | 361/700 |
| 4,283,754 A | * | 8/1981 | Parks ........................... | 361/703 |
| 4,386,568 A | * | 6/1983 | Ziemba ........................ | 102/204 |
| 4,531,791 A | | 7/1985 | Bauchet | |
| 4,888,663 A | | 12/1989 | Longerich et al. | |
| 4,903,603 A | | 2/1990 | Longerich et al. | |
| 4,922,381 A | | 5/1990 | Longerich et al. | |
| 4,949,917 A | | 8/1990 | Cottle, Jr. et al. | |
| 5,394,609 A | | 3/1995 | Ferguson et al. | |
| 5,425,514 A | | 6/1995 | Grosso | |

OTHER PUBLICATIONS

Duran, Jacques, Trans., *Sands, Powders, and Grains: An introduction to the Physics of Granular Materials*, Springer–Verlag, New York, 2000, p. 60.

* cited by examiner

*Primary Examiner*—Michael J. Carone
*Assistant Examiner*—Troy Chambers
(74) *Attorney, Agent, or Firm*—Thomas J. Finn; Leonard A. Alkov; Karl A. Viok

(57) ABSTRACT

A guidance electronics unit is provided for an explosively-launched vehicle, e.g., a projectile or missile, comprising a plurality of circuit card assemblies, each circuit card assembly containing a plurality of electronic components and interconnections, each circuit card assembly maintained in a housing and spaced apart. All spaces surrounding each circuit card assembly are filled with a granular material to provide support for each circuit card assembly during explosive launch. Further, a method for supporting circuit card assemblies in the guidance electronics unit is provided. The problem of enabling guidance electronics to survive the large loads encountered during an explosive launch out of a gun, such as a howitzer, or missile launch tube is thereby solved.

15 Claims, 4 Drawing Sheets

GRANULAR MATTER FILLED WEAPON GUIDANCE ELECTRONICS UNIT

TECHNICAL FIELD

The present invention is directed to guidance electronics units, and, more particularly, to stabilizing circuit cards in such units so as to avoid damage during the shock of gun launch.

BACKGROUND ART

Guided weapon design necessitates the need for a guidance electronics unit (GEU), which is the brain of the system. The GEU includes functions such as the mission computer, guidance, navigation, and control of the weapon, along with other weapon specific functions. The GEU consists of multiple circuit card assemblies (CCAs) that are usually arranged in close proximity to each other.

Guidance electronics units (GEUs) are used in a variety of weapons that are subject to sudden forces during an explosive launch, such as firing the weapon from a gun or howitzer or launching a missile.

Typical designs for a guidance electronics unit consists of circuit card assemblies held together by metal housings, often with very precise machining. These metal housings are very expensive to produce and take a long time to design and develop.

U.S. Pat. No. 4,888,663, entitled "Cooling System for Electronic Assembly", and issued on Dec. 19, 1989, to Ernest P. Longerich et al, and related U.S. Pat. Nos. 4,922,381 and 4,903,603, disclose a plurality of circular circuit cards, arranged in an aligned, parallel relationship in a sealed unit. An electrically insulating coolant liquid is disposed in the sealed unit in direct contact with the circuit cards and electrical components mounted thereon to absorb heat generated by electrical power dissipation. For extremely high "G" forces, in excess of 100,000 G, a plurality of ceramic circuit cards is spaced apart by a plurality of ceramic spacer cards and bolted together.

However, it appears that there is little prior art that deals with protecting rigidly-mounted guidance electronics units against the shock of explosive launch. For example, U.S. Pat. No. 4,949,917, entitled "Gyro Stabilized Optics with Fixed Detector", issued on Aug. 21, 1990, to Wilber W. Cottle et al, illustrates a plurality of circuit card assemblies (CCAs), but no mechanism is disclosed or suggested for protecting the CCAs during an explosive launch, such as from a howitzer.

Thus, there remains a need for supporting the internal components of a guidance system, and, in particular, for stabilizing circuit card assemblies and their interconnects in such guidance electronics units so as to avoid damage during the shock of an explosive launch.

DISCLOSURE OF INVENTION

In accordance with the present invention, granular material is used to essentially completely fill the void in the guidance housing and surround the circuit card assemblies so that there is little chance that anything can move. Such granular material, which is similar to the consistency of fine beach sand, does not compress during the shock of gun launch; consequently, no damage to any of the circuit cards or components on the cards occurs. The granular material surrounds the circuit cards so that any loads on the guidance electronics unit are distributed much more equally throughout the circuit cards. The granular material also holds large components in place so that they survive any shock or vibration loads that are often made worse due to their mass.

More specifically, in accordance with the present invention, a guidance electronics unit is provided for an explosively-launched vehicle comprising a plurality of circuit card assemblies, each circuit card assembly containing a plurality of electronic components and interconnections, each circuit card assembly maintained in a housing and spaced apart. All spaces surrounding each circuit card assembly are filled with the granular material to provide support for each circuit card assembly during explosive launch.

Further in accordance with the present invention, a method is provided for supporting the circuit card assemblies in the guidance electronics unit. The method comprises:

placing each circuit card assembly in the housing in a stacked, spaced apart configuration, and substantially filling all spaces surrounding each circuit card assembly with a granular material to provide support for each circuit card assembly during explosive launch.

The present invention solves the problem of making it possible for guidance electronics to survive the large loads encountered during an explosive launch out of a gun or howitzer. The teachings of the present invention may also be used in a guided missile electronics unit using a hollow glass sphere fill material, so that the weight of the fill material is not an issue.

No known Weapons Guidance Electronics Unit uses granular matter as the structural support of the circuit cards. The present invention could dramatically decrease cost, while increasing simplicity, reworkability, and survivability of numerous weapons.

BEST MODES FOR CARRYING OUT THE INVENTION

Nearly all weapons undergo significant mechanical shock and vibration loads due to harsh environments to which they are exposed. These environments can include such things as transportation, launch, and captive carry on an aircraft. These loads cause the guidance electronic unit (GEU) to use a structural cage, usually made out of metal, to constrain the GEU circuit card assemblies (CCAs) to ensure that the sensitive electronic components on the GEU CCAs and the electrical interconnections remain functional.

Figure 1:
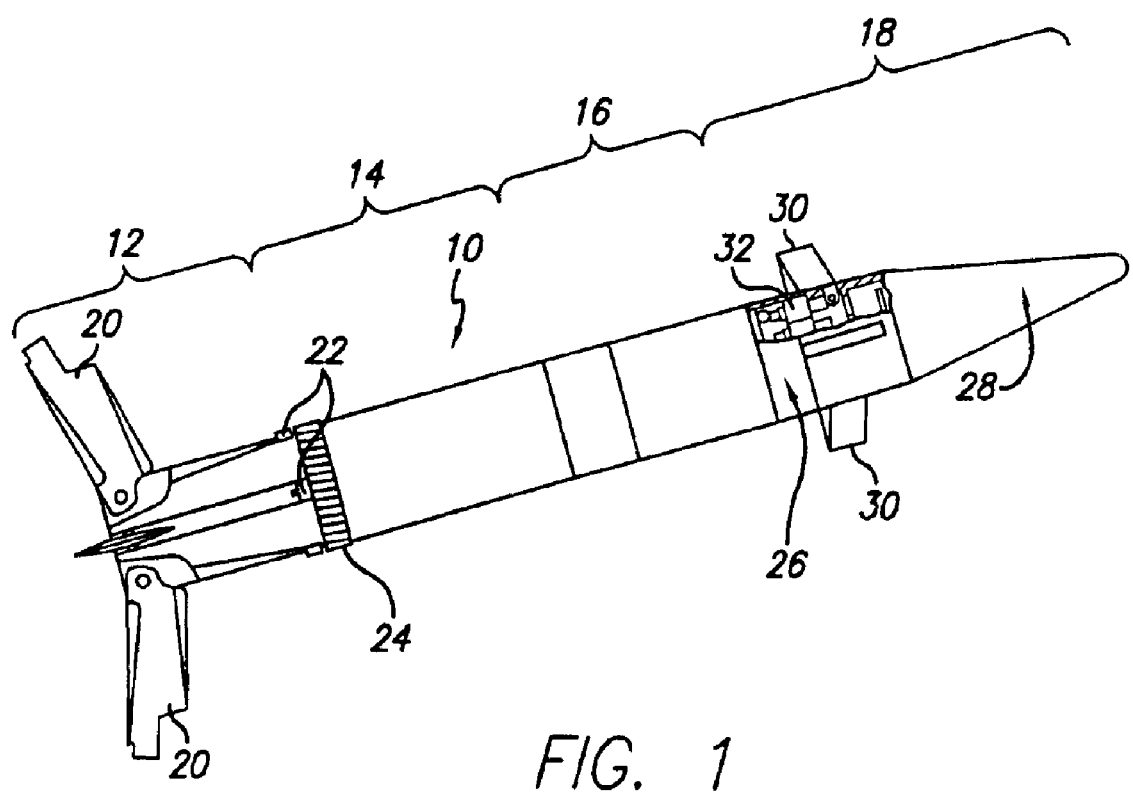
FIG. 1 is a side elevational view of a prior art cannon-launched guided projectile.

FIG. 1 depicts a common projectile 10, such as a cannon-launched guided projectile. The projectile 10 comprises a base section 12 at its aft end, and proceeding from the aft end to the forward end a propulsion section 14, a payload section 16, and a guidance section 18.

The base section 12 includes a plurality of stabilizing fins 20, which in the firing position are held flush with the outer surface of the base section 12 by latching mechanism 22. When the projectile is fired, a slipping obturation band 24 seals the projectile against the interior of the cannon barrel (not shown) to prevent the escape of propulsion gases. When the spinning projectile leaves the cannon barrel, the stabilizing fins 20 are deployed to stabilize the projectile in flight.

The propulsion system 14 includes a rocket motor (not shown) and ignitor (not shown), as is well-known for such projectiles.

The payload section 16 includes a warhead (not shown) and ignitor (not shown), as is well-known for such projectiles.

The payload section 16 includes a warhead (not shown) and fuze (not shown), as is well-known for such projectiles. The warhead may be, for example, a typical high explosive 155 mm howitzer shell, or other explosive material, such as used in sudden launch munitions, including, but not limited to, projectiles, missiles, and the like.

Figure 2A:
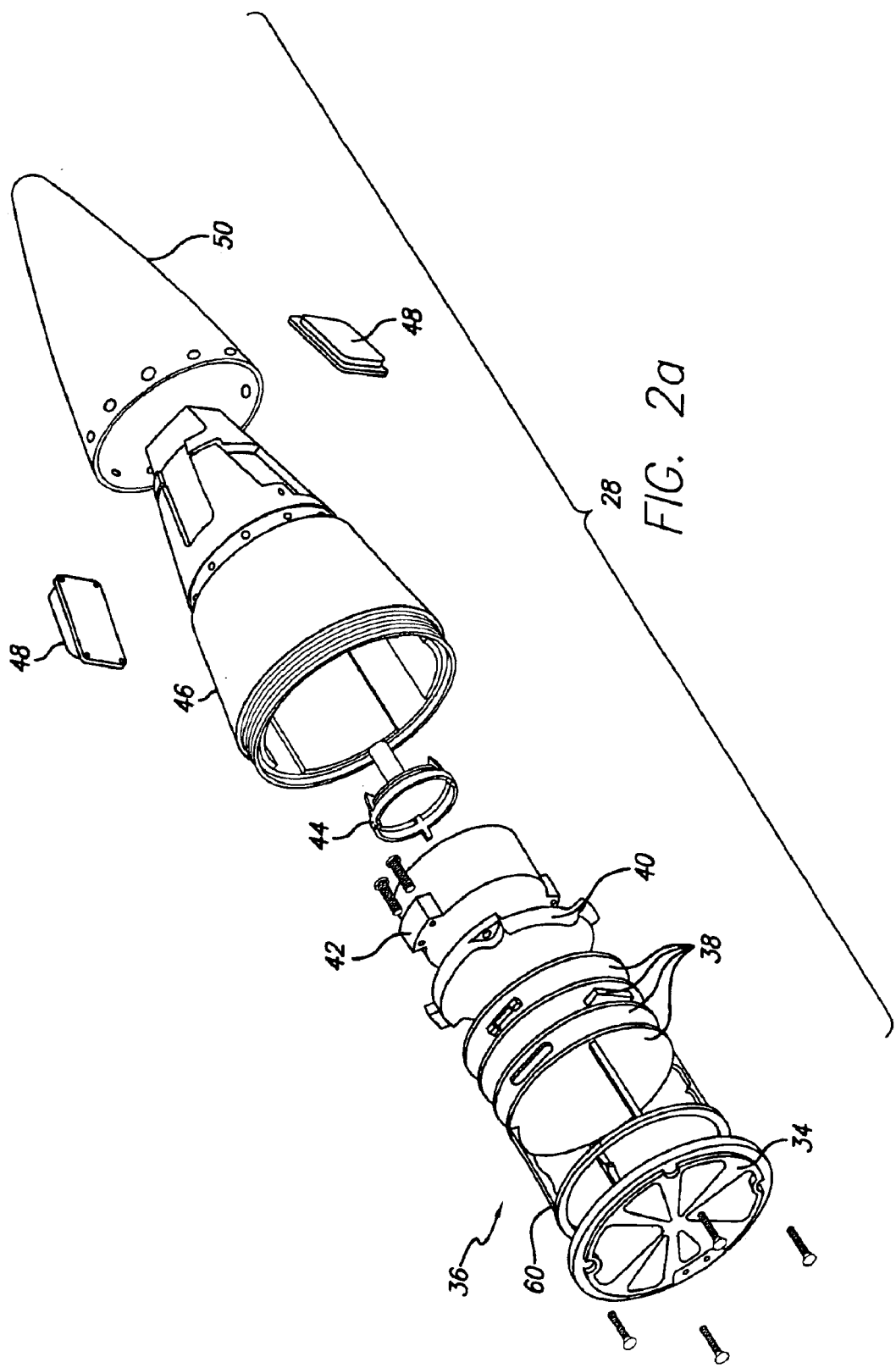
FIGS. 2a–2b are enlarged views of the guidance section of the projectile of FIG. 1, with FIG. 2a showing an exploded view and FIG. 2b showing an assembled view, without attachment of the radome.
Figure 2B:
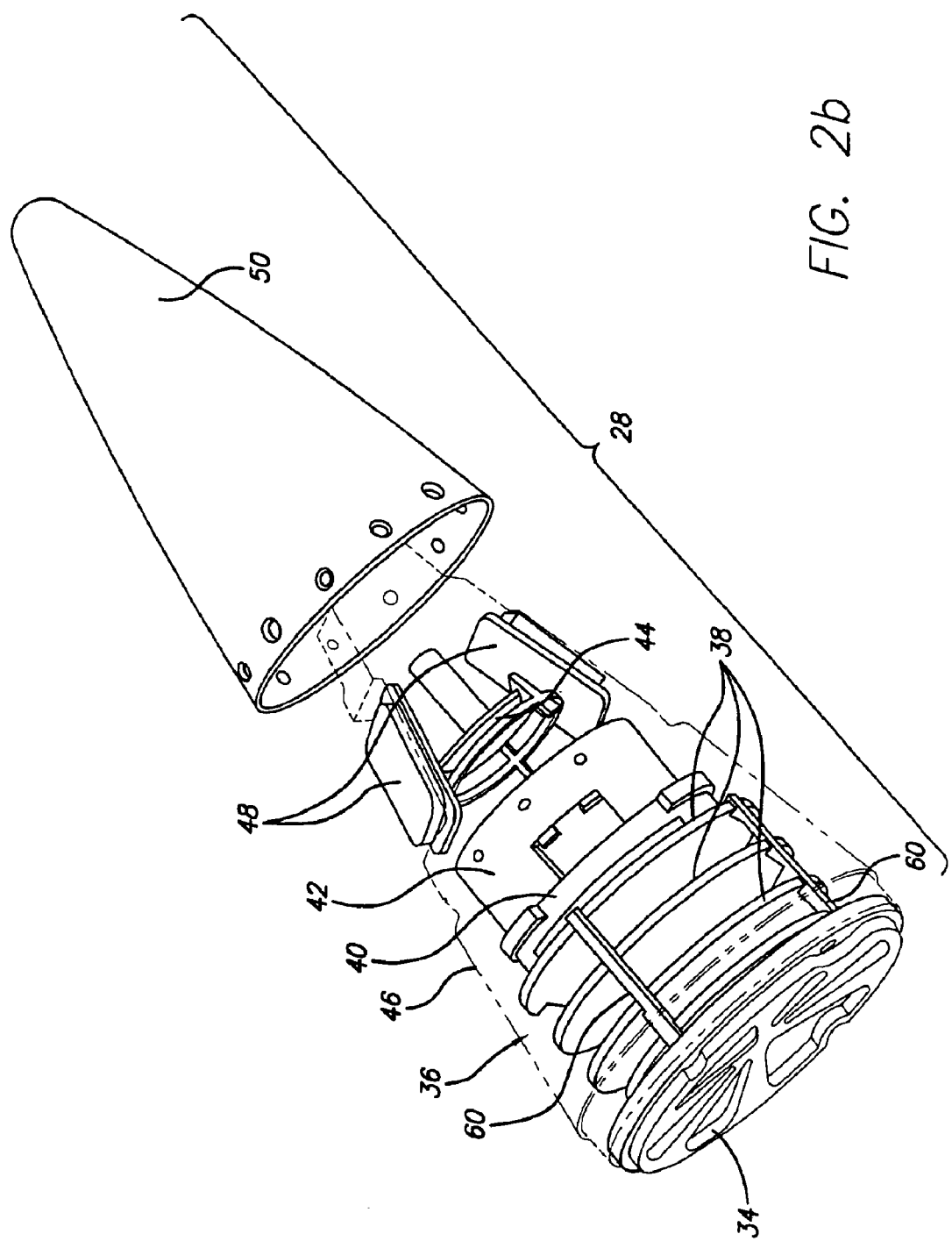

The guidance section 18 comprises a control section 26 and a guidance navigation unit 28 (shown in greater detail in FIGS. 2a–2b). The control section 26 includes a plurality of canards 30 which are actuated by servo actuators 32, as well as one or more thermal batteries (not shown). The servo actuators 32 are actuated by the output signals of the guidance navigation unit.

The guidance navigation unit (GNU) 28 is shown more completely in FIGS. 2a–2b, which depict the details of the guidance section 18, and includes, in order from aft to forward end, a GNU base plate 34, a guidance electronics unit (GEU) 36 that comprises a plurality of circuit card assemblies (CCAs) 38, an inertial measurement unit (IMU) mounting plate 40 on which the IMU 42 is mounted, and a super capacitor assembly 44 that acts as a power supply. The GNU 28 is housed in a housing 46. A global positioning satellite (GPS) antenna 48, comprising two circuit cards, is mounted on the outside of the housing 46. A radome 50 covers the entire GNU 28, and is transparent to the radio frequency (rf) radiation received by the GPS antenna 48. There are additional sensors, electronics, and interconnects in the GNU that are not shown here, and are not relevant to the teachings herein. Such additional components, however, are well-known to those skilled in this art.

The GEU 36 comprising the plurality of circuit card assemblies 38 described above is shown in greater detail in FIGS. 3a–3b and 4a–4b.

Figure 3A:
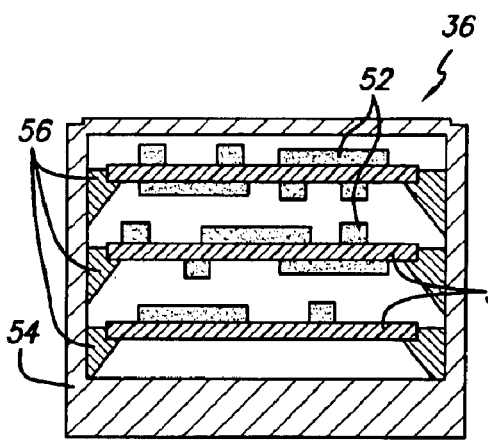
FIGS. 3a–3b depict a common prior art approach to supporting circuit card assemblies in guidance electronics units, with FIG. 3a illustrating the structure before explosive launch and FIG. 3b illustrating the structure resulting in "oil-canning" during explosive launch.
Figure 3B:
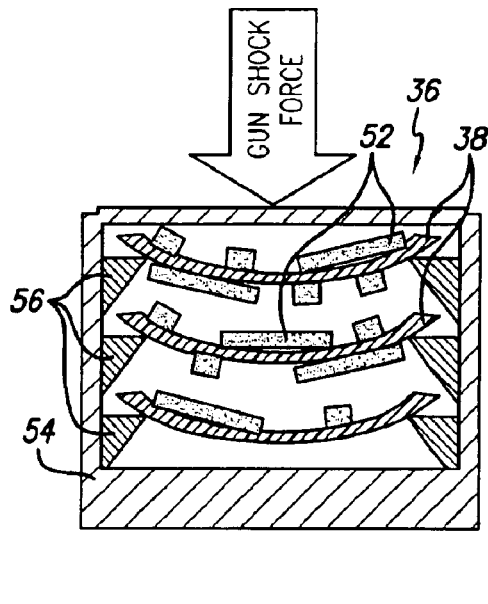

FIGS. 3a–3b depict a common prior art approach to supporting circuit card assemblies in guidance electronics units, with FIG. 3a illustrating the structure before explosive launch and FIG. 3b illustrating the structure during explosive launch, resulting in "oil canning", or bending of each circuit card assembly 38. Each circuit card assembly 38 supports a variety of electronic components 52 and is contained in housing 54. Specifically, each circuit card assembly 38 is supported on a structure 56 that sup ports the circuit card assembly around its perimeter.

During explosive launch, such as from a gun, the G forces are sufficient to cause "oil caring", as the circuit card assemblies 38 bend in reaction to the gun shock force. Such bending adversely impacts the electronic components 52 and their interconnections, due to the sensitivity of the multiple bonds between the electronic components and the circuit card assemblies. The amount of displacement in FIG. 3b is exaggerated to show the effect on the bonds between electronics components 52 and circuit card assemblies 38.

Figure 4A:
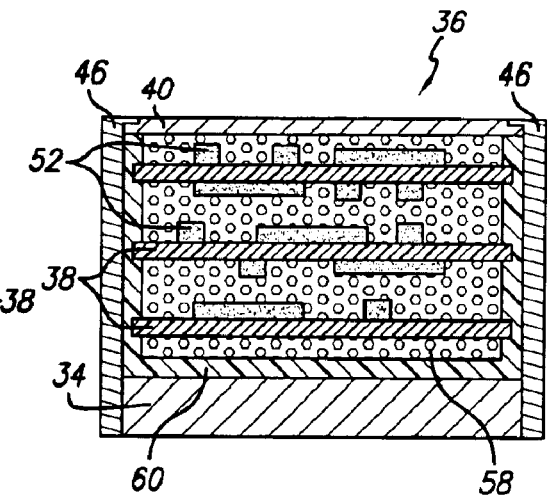
FIGS. 4a–4b depict the analogous structures resulting from the teachings of the present invention, with FIG. 4a illustrating the structure before launch and FIG. 4b illustrating the structure during launch.

In accordance with the present invention, the space between each circuit card assembly 38 is filled with a granular matter 58, thereby obviating the need for supporting structure 56, as shown in FIG. 4a. During explosive launch, the granular matter 58 uniformly supports each circuit card assembly 38, and there is no bending of the circuit card assemblies as a result of the shock force. The circuit card assemblies 38 remain in planar configuration, and the electronic components 52 are not adversely impacted by the explosive launch.

Figure 4B:
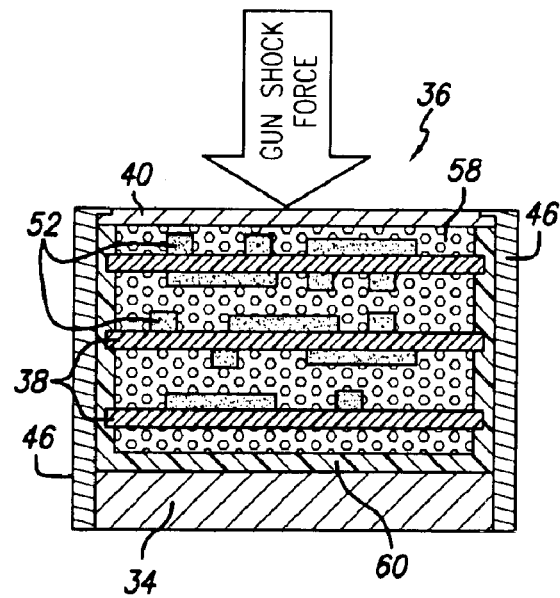

The circuit card assemblies 38 are held in spaced-apart configuration by a holder 60 (shown also in FIGS. 2a–2b), which does not support the circuit cards during explosive launch but rather spaces the circuit cards apart during filling with the granular matter 58. Accordingly, the holder 60, also shown in FIGS. 4a–4b, is made of a lightweight material, such as fused powder nylon or injection-molded plastic.

The granular matter 58 fills up the spaces between the circuit card assemblies 38 to the point necessary to support them, the electronic components 52 thereon, and the electrical interconnects thereto.

The present invention eliminates the need for a rigid cage, or structure, 54 by using the granular matter 58 essentially as a potting compound that can be filled and removed if necessary. Utilizing media for a potting compound that can be removed in lieu of more permanent potting compounds such as epoxies allows for disassembly and rework of the system. Being able to remove the granular matter 58 allows disassembly and rework of the GEU, which is almost always a necessity in guided weapons development, has advantages during production, such as post-lot acceptance testing analysis.

The granular matter 58 chosen for this application was glass beads, which are small pieces of glass having a diameter smaller than 250 microns (10 mils; 0.010 inch). Hollow glass spheres, referred to as "microballoons" are a viable alternative in order to reduce the weight of the GEU 36, since the density of microballoons is approximately ⅛th that of glass beads. There are a myriad of viable granular matter alternatives that would serve the same function as glass beads and allow the granular matter 58 to be removed from the system. Some of these alternatives provide thermal transfer by having higher thermal conductivity than glass beads, which are a very good insulator. This is important in cases where the electrical components heat up during use and the heat needs to be dissipated. Other alternatives provide electromagnetic interference advantages, by shielding the system or components from electromagnetic waves that are harmful to the system or components, or by preventing the system or components from transmitting specific electromagnetic frequencies that are harmful to other systems or components.

While a number of various granular matter 58 may be used in the practice of the present invention, glass beads are preferred. Microballoons, though of lower density, are less structurally tolerant of high G forces than are glass beads.

Glass beads are presently commercially available in three size ranges: "coarse" (0.0059 to 0.098 inch), "fine" (0.0035 to 0.0059 inch), and "extra fine" (0.0017 to 0.0035 inch). A blend of various size ranges may be used, for better close-packing. However, glass beads of a single size range (e.g., "coarse") may alternatively be used, with no measurable difference in performance between single size ranges and blended size ranges.

The granular matter 58 provides unilateral support of the CCAs 38 inside the GEU 36. During static and dynamic environments, each CCA 38 is supported along the entire surface of each of the boards. There is little to no point loading of the CCAs 38 from the assembly fixture or cardholder 60, thereby preventing phenomena such as "oil-canning" (shown in FIG. 3*b*) from causing failures in the electronic components 52. The stress pattern observed in a granular matter under compression is shown in FIG. 34, page 60 of the book *Sands, Powders, and Grains: An Introduction to the Physics of Granular Materials*, by Jacques Duran. The text of the book describes the phenomenon of the granular matter, that "the (vertical load) stress tends to be redirected laterally toward the vertical walls".

A tightly packed granular matter GEU would, therefore, redirect loads laterally to the direction of the load, allowing the load to be spread over the entire filled cavity and allow the GEU to withstand loads from any direction. Tightly packing the granules 58 into the GEU is accomplished by vibrating the housing 46 during the fill process. This allows the granules 58 to pack well and also reduces the time it takes to fill the GEU.

While the foregoing description has been primarily directed to explosively-launched projectiles, such as from guns, it will be readily appreciated by those skilled in this art that the same teachings may be advantageously employed in missiles, which are also explosively launched from missile tubes. Such missiles also include a unit equivalent to the projectile's guidance electronics unit, called a "guide missile electronics unit", comprising a plurality of circuit card assemblies, which are also subject to high G forces upon launching.

INDUSTRIAL APPLICABILITY

The use of granular material to support circuit card assemblies in guidance electronics units and guided missile electronics units is expected to find use in explosively-launched vehicles.

What is claimed is:

1. A guidance electronics unit for an explosively-launched vehicle comprising a plurality of circuit card assemblies, each circuit card assembly containing a plurality of electronic components and interconnections, each circuit card assembly maintained in a housing and spaced apart, wherein all spaces surrounding each circuit card assembly are filled with a granular material to provide support for each circuit card assembly during explosive launch.

2. The guidance electronics unit of claim 1 wherein said granular material has a particle size less than 250 microns.

3. The guidance electronics unit of claim 2 wherein said granular material comprises at least one particle size range.

4. The guidance electronics unit of claim 3 wherein said granular material comprises more than one particle size range.

5. The guidance electronics unit of claim 2 wherein said granular material comprises glass beads.

6. The guidance electronics unit of claim 2 wherein said granular material comprises microballoons.

7. The guidance electronics unit of claim 1 wherein said explosively-launched vehicle is selected from the group consisting of guided projectiles and missiles.

8. A method for supporting circuit card assemblies in a guidance electronics unit for an explosively-launched vehicle, each circuit card assembly containing a plurality of electronic components and interconnections, said method comprising:

placing each circuit card assembly in a housing in a spaced apart configuration, and substantially filling all spaces surrounding each circuit card assembly with a granular material to provide support for each circuit card assembly during explosive launch.

9. The method of claim 8 wherein said granular material has a particle size less than 250 microns.

10. The method of claim 9 wherein said granular material comprises at least one particle size range.

11. The method of claim 10 wherein said granular material comprises more than one particle size range.

12. The method of claim 9 wherein said granular material comprises glass beads.

13. The method of claim 9 wherein said granular material comprises microballoons.

14. The method of claim 8 wherein said explosively-launched vehicle is selected from the group consisting of guided projectiles and missiles.

15. The method of claim 8 wherein said granular material is tightly packed into said guidance electronics unit by vibrating said housing during filling.

\* \* \* \* \*